United States Patent
Lee et al.

(10) Patent No.: US 11,703,545 B2
(45) Date of Patent: Jul. 18, 2023

(54) ROTOR INPUT DETECTION APPARATUS AND ELECTRONIC DEVICE INCLUDING THE SAME

(71) Applicant: SAMSUNG ELECTRO-MECHANICS CO., LTD., Suwon-si (KR)

(72) Inventors: Gye Won Lee, Suwon-si (KR); Hong Seok Lee, Suwon-si (KR); Hee Sun Oh, Suwon-si (KR); Chang Ju Lee, Suwon-si (KR); Mun Sun Jung, Suwon-si (KR); Jong Yun Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 37 days.

(21) Appl. No.: 17/488,481

(22) Filed: Sep. 29, 2021

(65) Prior Publication Data
US 2023/0003799 A1    Jan. 5, 2023

(30) Foreign Application Priority Data
Jun. 30, 2021    (KR) .......................... 10-2021-0085943

(51) Int. Cl.
*G06F 3/0362*    (2013.01)
*G01R 31/34*    (2020.01)
*H02P 6/16*    (2016.01)

(52) U.S. Cl.
CPC .............. *G01R 31/343* (2013.01); *H02P 6/16* (2013.01)

(58) Field of Classification Search
CPC ....... G01R 31/343; H02P 6/16; G06F 3/0362; G06F 3/038; G06F 3/044

USPC ...................................................... 324/765.01
See application file for complete search history.

(56) References Cited

U.S. PATENT DOCUMENTS

| | | | | |
|---|---|---|---|---|
| 8,838,170 | B2 * | 9/2014 | Sugahara ................ | G06F 3/016 340/407.1 |
| 2009/0066322 | A1 * | 3/2009 | Shintani .................. | G01D 5/04 324/207.24 |
| 2013/0229078 | A1 * | 9/2013 | Garber .................... | H02K 7/025 310/90.5 |
| 2016/0154485 | A1 * | 6/2016 | Kampt .................. | G06F 3/0383 345/179 |
| 2016/0248311 | A1 * | 8/2016 | Isbell ........................ | F21L 4/08 |
| 2017/0045958 | A1 * | 2/2017 | Battlogg ................. | G06F 1/169 |

(Continued)

FOREIGN PATENT DOCUMENTS

| | | | | |
|---|---|---|---|---|
| CN | 104704234 A | * | 6/2015 | ............. F03D 15/00 |
| CN | 109144173 A | * | 1/2019 | ............... G04B 3/04 |
| JP | 2001346395 A | * | 12/2001 | ............... H02P 6/16 |

(Continued)

*Primary Examiner* — Tung X Nguyen
*Assistant Examiner* — Robert P Alejnikov, Jr.
(74) *Attorney, Agent, or Firm* — NSIP Law

(57) ABSTRACT

An apparatus that detects a rotor input is provided. The apparatus includes a rotor comprising at least a portion which is configured to rotate around an axis of rotation; a reactance element disposed in the rotor, a sensing medium member disposed in the rotor, and a motion conversion member configured to move in the rotor based on a rotation of the portion of the rotor, and configured to move together with the sensing medium member to change a reactance of the reactance element according to the rotation of the portion of the rotor.

19 Claims, 12 Drawing Sheets

(56) References Cited

U.S. PATENT DOCUMENTS

2019/0089059 A1* 3/2019 Pelrine .................... H01Q 7/06

FOREIGN PATENT DOCUMENTS

| JP | 2007-80778 A | 3/2007 | | |
|----|----|----|----|----|
| KR | 10-2017-0085826 A | 7/2017 | | |
| KR | 10-2018-0127454 A | 11/2018 | | |
| KR | 20230020716 A | * 2/2023 | ............ | H02K 44/00 |
| WO | WO-2020093846 A1 | * 5/2020 | ............ | H04M 1/026 |

* cited by examiner

ROTOR INPUT DETECTION APPARATUS AND ELECTRONIC DEVICE INCLUDING THE SAME

CROSS-REFERENCE TO RELATED APPLICATION(S)

This application claims the benefit under 35 USC 119(a) of Korean Patent Application No. 10-2021-0085943 filed on Jun. 30, 2021, in the Korean Intellectual Property Office, the entire disclosure of which is incorporated herein by reference for all purposes.

BACKGROUND

1. Field

The following description relates to a rotor input detection apparatus, and an electronic device including the same.

2. Description of Related Art

Recently, types and form factors of electronic devices have diversified. Additionally, the diversity of functions associated with the electronic devices has increased.

Accordingly, an electronic device may be provided with a rotator that satisfies various user demands, based on the efficient movement and design of the rotor.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In a general aspect, a rotor input detecting apparatus includes a rotor comprising at least a portion which is configured to rotate around an axis of rotation; a first reactance element disposed in the rotor; a sensing member disposed in the rotor; and a motion conversion member configured to move in the rotor based on a rotation of the portion of the rotor, and configured to move together with the sensing member to change a reactance of the reactance element according to the rotation of the portion of the rotor.

The motion conversion member may be configured to move such that a separation distance between the reactance element and the sensing member changes based on the rotation of the portion of the rotor.

At least a portion of a surface of the sensing member may be inclined with respect to a side surface of the rotor.

The reactance element may be disposed to overlap the sensing member in a direction perpendicular to a side surface of the rotor based on a movement of the motion conversion member.

The motion conversion member may be configured to perform motion conversion between a rotational motion and a translational motion.

At least a surface of the sensing member may be configured to have a conductivity higher than a conductivity of the motion conversion member.

The rotor may include a core rotor and a cover rotor configured to cover a portion of the core rotor, and the motion conversion member may be configured to move together with the sensing member such that the reactance of the reactance element changes based on a relative rotation of the cover rotor with respect to the core rotor.

The reactance element may be disposed in a portion of the core rotor that is not surrounded by the cover rotor, and at least a portion of the motion conversion member may be surrounded by the cover rotor.

A side surface of at least a portion of the core rotor, not surrounded by the cover rotor, may be configured to vary a separation distance with respect to the reactance element when an external force is applied to the rotor.

The apparatus may further include a reference member connected to the sensing member, and configured to overlap the reactance element in a direction perpendicular to a side surface of the rotor based on a movement of the motion conversion member, wherein a surface of the reference member, facing the side surface of the rotor, may be inclined with respect to a surface of the sensing member facing the side surface of the rotor.

The apparatus may further include a first resonant circuit capacitor disposed in the rotor, wherein the reactance element comprises a first sensing inductor, and an inductance of the first sensing inductor is changed based on a rotation of at least the portion of the rotor to form a resonance together with the first resonant circuit capacitor.

The apparatus may further include a second reactance element disposed in the rotor, wherein a reactance of the second reactance element may be changed based on one of a touch and an external force applied to a side surface of the rotor, wherein the second reactance element may include a sensing capacitor disposed in the rotor, and a capacitance of the sensing capacitor may be changed based on the touch applied to the side surface of the rotor.

The apparatus may further include a second reactance element disposed in the rotor, wherein a reactance of the second reactance element may change based on one of a touch and an external force applied to a side surface of the rotor.

The second reactance element may include a sensing capacitor disposed in the rotor, wherein a capacitance of the sensing capacitor changes based on the touch applied to the side surface of the rotor; and a second sensing inductor disposed in the rotor, wherein an inductance of the second sensing inductor changes based on an external force applied to a portion of the side surface of the rotor, overlapping the sensing capacitor.

The sensing member may be disposed between the motion conversion member and the second reactance element.

the apparatus may further include an integrated circuit (IC) electrically connected to the reactance element; and a substrate on which the IC and the reactance element are disposed.

The apparatus may further include a second reactance element disposed in the rotor, wherein a reactance of the second reactance element may be changed based on one of a touch and an external force applied to a side surface of the rotor, wherein the second reactance element may be electrically connected to the IC and is disposed on the substrate.

In a general aspect, an electronic device includes a rotor input detecting apparatus, the rotor detecting apparatus including a rotor comprising at least a portion which is configured to rotate around an axis of rotation; a first reactance element disposed in the rotor; a sensing member disposed in the rotor; a motion conversion member configured to move in the rotor based on a rotation of the portion of the rotor, and configured to move together with the sensing member to change a reactance of the first reactance element according to the rotation of the portion of the rotor, and a body connected to the rotor.

The body may be at least a portion of a wearable electronic device.

Other features and aspects will be apparent from the following detailed description, the drawings, and the claims.

DETAILED DESCRIPTION

Figure 1A:
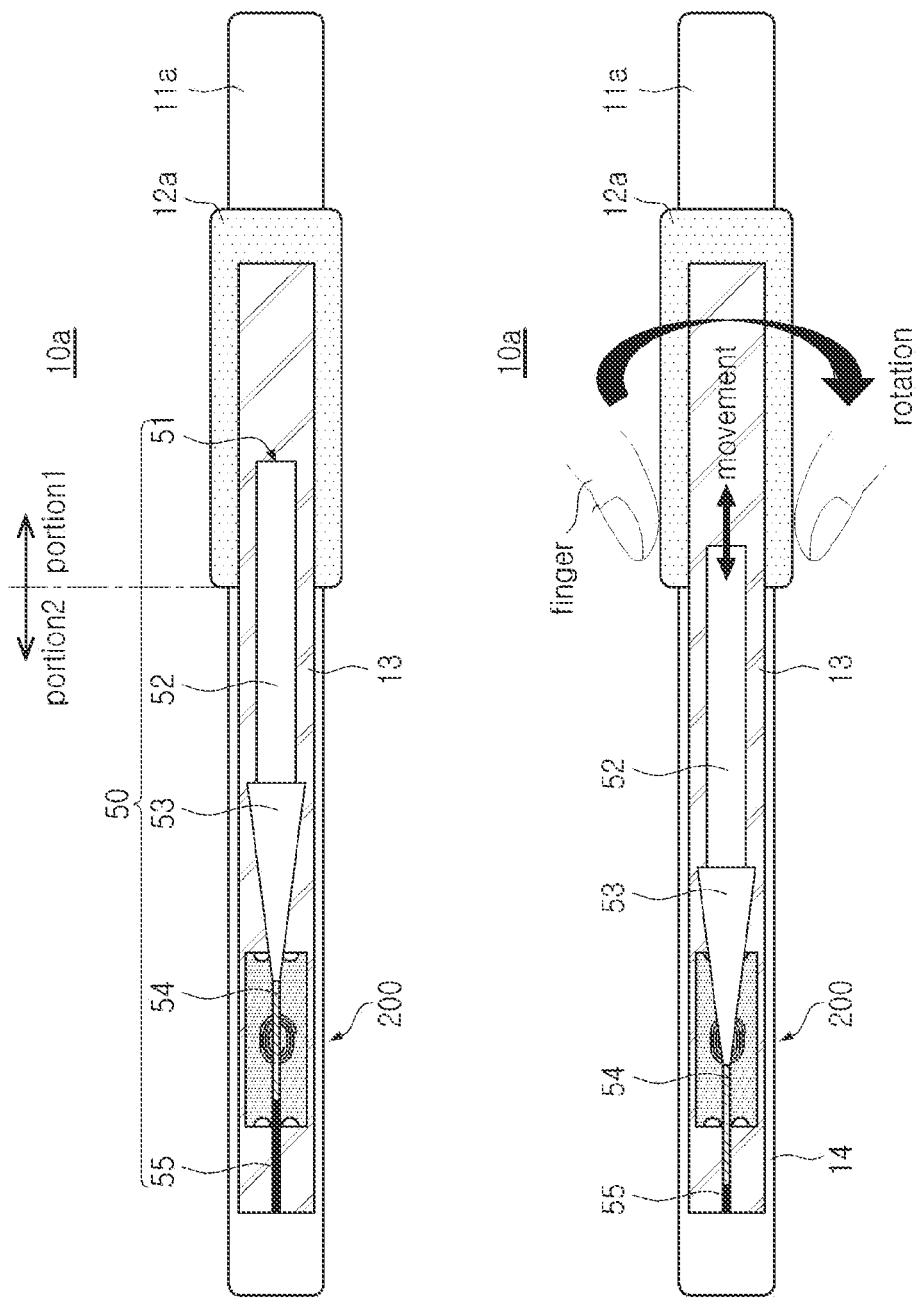
FIG. 1A is an example view illustrating an example apparatus that detects a rotor input, in accordance with one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of the application, may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is to be noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape occurring during manufacturing.

As used herein, the term "and/or" includes any one and any combination of any two or more of the associated listed items.

Unless otherwise defined, all terms, including technical and scientific terms, used herein have the same meaning as commonly understood by one of ordinary skill in the art to which this disclosure pertains after an understanding of the disclosure of this application. Terms, such as those defined in commonly used dictionaries, are to be interpreted as having a meaning that is consistent with their meaning in the context of the relevant art and the disclosure of the present application, and are not to be interpreted in an idealized or overly formal sense unless expressly so defined herein.

The features of the examples described herein may be combined in various manners as will be apparent after gaining an understanding of the disclosure of this application. Further, although the examples described herein have a variety of configurations, other configurations are possible as will be apparent after gaining an understanding of the disclosure of this application.

The drawings may not be to scale, and the relative sizes, proportions, and depictions of elements in the drawings may be exaggerated for clarity, illustration, and convenience.

FIG. 1A is a view illustrating an example apparatus that detects rotor input, in accordance with one or more embodiments.

Referring to FIG. 1A, an apparatus 10a that detects rotor input, in accordance with one or more embodiments, may include a first reactance element 200, a sensing medium member 53 and a motion conversion member 52, and may detect an input, for example, a rotation, of the rotor.

The reactance element 200 may be disposed in a rotor configured in such a manner that at least a portion (e.g., a cover rotor 12a) rotates around an axis of rotation, e.g., in a horizontal direction of FIG. 1A.

Reactance of the reactance element 200 may correspond to inductance, or may correspond to capacitance. Accordingly, the reactance element 200 may include at least one of an inductor and a capacitor, but is not limited thereto.

Since a reactance-based input detecting method as in the reactance element 200 may not require a complex mechanical structure, the method may be an advantageous method to be provided in a small rotor, and may be an advantageous method for the rotor to stably detect the input.

Additionally, reactance may be used to form resonance, and since an electrical phenomenon according to resonance may be sensitive to changes in reactance, the reactance-based input detecting method as in the reactance element 200 may effectively increase the input sensing sensitivity of the rotor, and may be an advantageous method for a rotor to stably sense the input.

The sensing medium member 53 may be disposed in the rotor. In an example, the sensing medium member 53 and the reactance element 200 may be embedded in a core rotor 11a of the rotor, and in one or more examples, may be disposed to be spaced apart from each other.

The motion conversion member 52 may move together with the sensing medium member 53 in the rotor, such that the reactance (e.g., mutual inductance) of the reactance element 200 according to the sensing medium member 53 changes, according to the rotation of at least a portion (e.g., the cover rotor 12a) of the rotor.

Accordingly, the reactance of the reactance element 200 may be used to detect a rotational input, and the example apparatus 10a that detects a rotor input, in accordance with one or more embodiments, may efficiently detect the rotation of at least a portion (e.g., the cover rotor 12a) of the rotor, or may be further miniaturized compared to the rotation detection sensitivity.

In example, the sensing medium member 53 may not overlap the reactance element 200 before at least a portion (e.g., the cover rotor 12a) of the rotor is rotated, and may overlap the reactance element 200 in a direction, perpendicular to the side surface of the rotor (e.g., the core rotor 11a), after at least a portion (e.g., the cover rotor 12a) of the rotor is rotated.

The reactance of the reactance element 200 may be affected by a magnetic field and/or an electric field in a region overlapping the reactance element 200, and the magnetic field and/or electric field may change depending on whether or not the reactance element 200 and the sensing medium member 53 overlap. Accordingly, the reactance of the reactance element 200 may vary depending on whether the reactance element 200 and the sensing medium member 53 overlap.

The motion conversion member 52 may perform motion conversion between a rotation movement and a translational movement. In one or more examples, a first end 51 of the motion conversion member 52, and the core rotor 11a of the rotor may perform motion conversion by being coupled to each other in a screwing manner, and one end 51 of the motion conversion member 52 may perform motion conversion by including a spring. The one end 51 of the motion conversion member 52 may have a structure in which a connecting line between the motion conversion member 52 and the core rotor 11a is wound or unwound according to the rotation of the core rotor 11a, thereby performing motion conversion.

In one or more examples, the sensing medium member 53 may be adhered to the motion conversion member 52, and may be formed on the surface of a second end of the motion conversion member 52. In an example, when the sensing medium member 53 includes a conductive material, the sensing medium member 53 may be plated on the surface of the second end of the motion conversion member 52.

Referring to FIG. 1A, the rotor may include the core rotor 11a and/or the cover rotor 12a. In one or more examples, the shape of each of the core rotor 11a and the cover rotor 12a may be a cylindrical shape, and may have a relatively flatter cylindrical shape.

The motion conversion member 52 may move in the rotor (e.g., the core rotor 11a or the cover rotor 12a) together with the sensing medium member 53, such that the reactance of the reactance element 200 according to the sensing medium member 53 may be changed depending on the relative rotation of the cover rotor 12a with respect to the core rotor 11a.

The core rotor 11a may provide an arrangement space for the reactance element 200. In an example, the core rotor 11a may include a support rotor 13 and a housing 14. The housing 14 may surround the support rotor 13, and the support rotor 13 may fill at least a portion of a space surrounded by the housing 14. In one or more examples, the support rotor 13 and the housing 14 may be implemented with an insulating material, e.g., plastic or ceramic, and may include a conductive structure (e.g., a wire, a portion of a substrate) electrically connected to the reactance element 200.

The cover rotor 12a may surround a portion of the core rotor 11a. In an example, one of first and second portions (portion1, portion2) may include at least a portion of the cover rotor 12a, and the other of the first and second portions (portion1, portion2) may include a portion of the core rotor 11a, not surrounded by the cover rotor 12a. Accordingly, since the portion of the rotor that detects rotation may be implemented more clearly, the apparatus 10a that detects rotor input may have an advantageous structure that stably senses the input. Additionally, the apparatus 10a that detects a rotor input may have a structure that may clearly inform a user where an input to a rotor should be applied.

The reactance element 200 may be disposed in a portion (e.g., the second portion (portion2)) that is not surrounded by the cover rotor 12a in the core rotor 11a. At least a portion of the motion conversion member 52 may be disposed in a portion (e.g., the first portion (portion1)) surrounded by the cover rotor 12a in the core rotor 11a. Accordingly, since a direct influence of the motion conversion of the motion conversion member 52 on the reactance of the reactance element 200 may be suppressed, the apparatus 10*a* that detects a rotor input may more accurately detect the rotation input.

In one or more examples, one of the first and second portions (portion1, portion2) may be configured to rotate more flexibly than the other of the first and second portions. In one or more examples, the cover rotor 12*a* may be rotated to slide on the side surface of the core rotor 11*a*.

In one or more examples, one of the first and second portions (portion1, portion2) may be disposed relatively closer to a first end of the rotor than a second end of the rotor. In one or more examples, the center of one of the first and second portions (portion1, portion2) may be relatively more biased toward one end of the rotor.

Referring to FIG. 1A, the apparatus 10*a* that detects rotor input according to an example may further include a reference member 54 connected to the sensing medium member 53 to selectively overlap the reactance element 200 according to the movement of the motion conversion member 52. Each of the motion conversion member 52, the sensing medium member 53, and the reference member 54 may be a portion of an overall member 50.

In one or more examples, the reference member 54 may be inserted into at least a portion of a free space 55, according to the movement of the motion conversion member 52, and may be configured to reduce a minute movement or vibrations of the rotor in a direction perpendicular to the side surface of the rotor in the movement of the motion conversion member 52 in a single direction. Accordingly, the apparatus 10*a* that detects a rotor input may more accurately detect the rotational input.

In one or more examples, a surface (e.g., a lower surface) of the reference member 54, facing the side of the rotor (e.g., the core rotor 11*a*), may be inclined with respect to a surface (e.g., a lower surface) of the sensing medium member 53, facing the side surface of the rotor. Accordingly, since the effect of the reference member 54 on the reactance of the reactance element 200 according to the movement of the motion conversion member 52 may be lower than the effect of the sensing medium member 53, the reactance element 200 may clearly provide a reference reactance, and the apparatus 10*a* for detecting rotor input may more efficiently detect the rotational input.

Figure 1B:
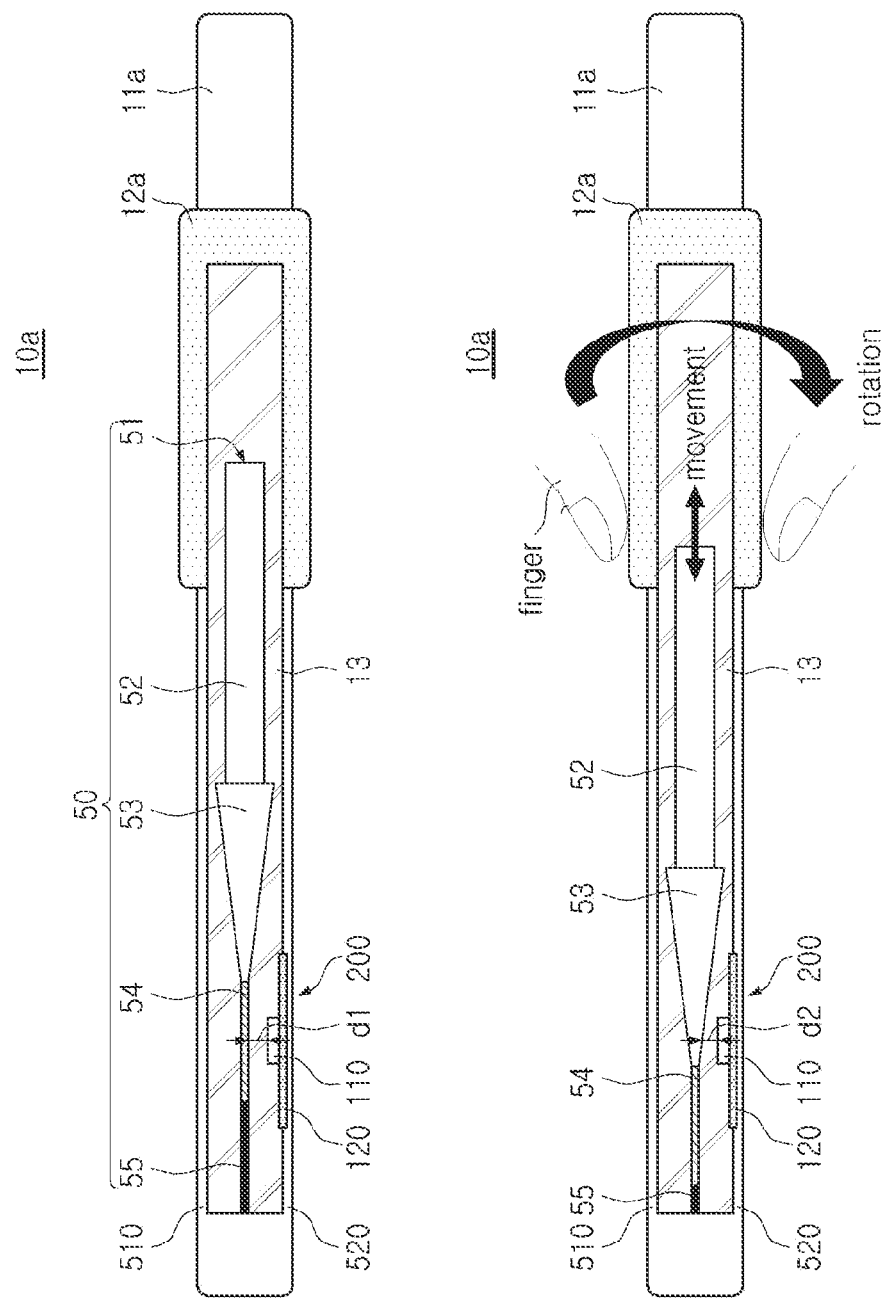
FIG. 1B is an example view illustrating an example apparatus that detects a rotor input of FIG. 1A.

FIG. 1B is an example view illustrating that the example apparatus that detects a rotor input of FIG. 1A detects rotation.

Referring to FIG. 1B, the motion conversion member 52 may move such that separation distances d1 and d2 between the reactance element 200 and the sensing medium member 53 change depending on rotation of at least a portion (e.g., the cover rotor 12*a*) of the rotor.

A first sensing inductor 110 of the reactance element 200 may output magnetic flux as a current flows in the first sensing inductor 110, and the magnetic flux may induce an eddy current flowing in the sensing medium member 53 overlapping the first sensing inductor 110. The eddy current may generate a secondary magnetic flux, and the inductance of the first sensing inductor 110 may vary according to a secondary magnetic flux. Among the inductances of the first sensing inductor 110, a mutual inductance may vary according to the secondary magnetic flux, and may vary according to a first or second distance d1 or d2.

Since the rate of change of the mutual inductance according to the separation distances d1 and d2 between the reactance element 200 and the sensing medium member 53 may increase as the eddy current increases, at least the surface of the sensing medium member 53 may have a higher conductivity than a conductivity of the motion conversion member 52. In one or more examples, the sensing medium member 53 and/or the reference member 54 may include a material with relatively high conductivity, e.g., copper, aluminum, silver, or gold, and the motion conversion member 52 may include a relatively light non-conductive material, such as a plastic.

In one or more examples, at least a portion of the surface (e.g., the lower surface) of the sensing medium member 53 may be inclined with respect to the side surface (e.g., the lower surface) of the rotor (e.g., the core rotor 11*a*). Accordingly, since the correspondence between the reactance of the reactance element 200 and the angular position of at least a portion (e.g., the cover rotor 12*a*) of the rotor may be denser, the apparatus 10*a* that detects a rotor input may detect rotation input more precisely.

However, the shape of the sensing medium member 53 is not limited to the shape of the sensing medium member 53 illustrated in FIGS. 1A and 1B. In one or more examples, the sensing medium member 53 may have a shape substantially the same as, or smaller than, the shape of the motion conversion member 52, and the reactance element 200 may be disposed to selectively overlap the sensing medium member 53 according to the movement of the motion conversion member 52.

On the other hand, a substrate 120, on which the first sensing inductor 110 is disposed, may be disposed in the other housing 520 and/or one housing 510 of the rotor (e.g., the core rotor 11). A housing including the one housing 510 and the other housing 520 may be included in the core rotor 11*a* and may surround the support rotor 13.

Figure 2:
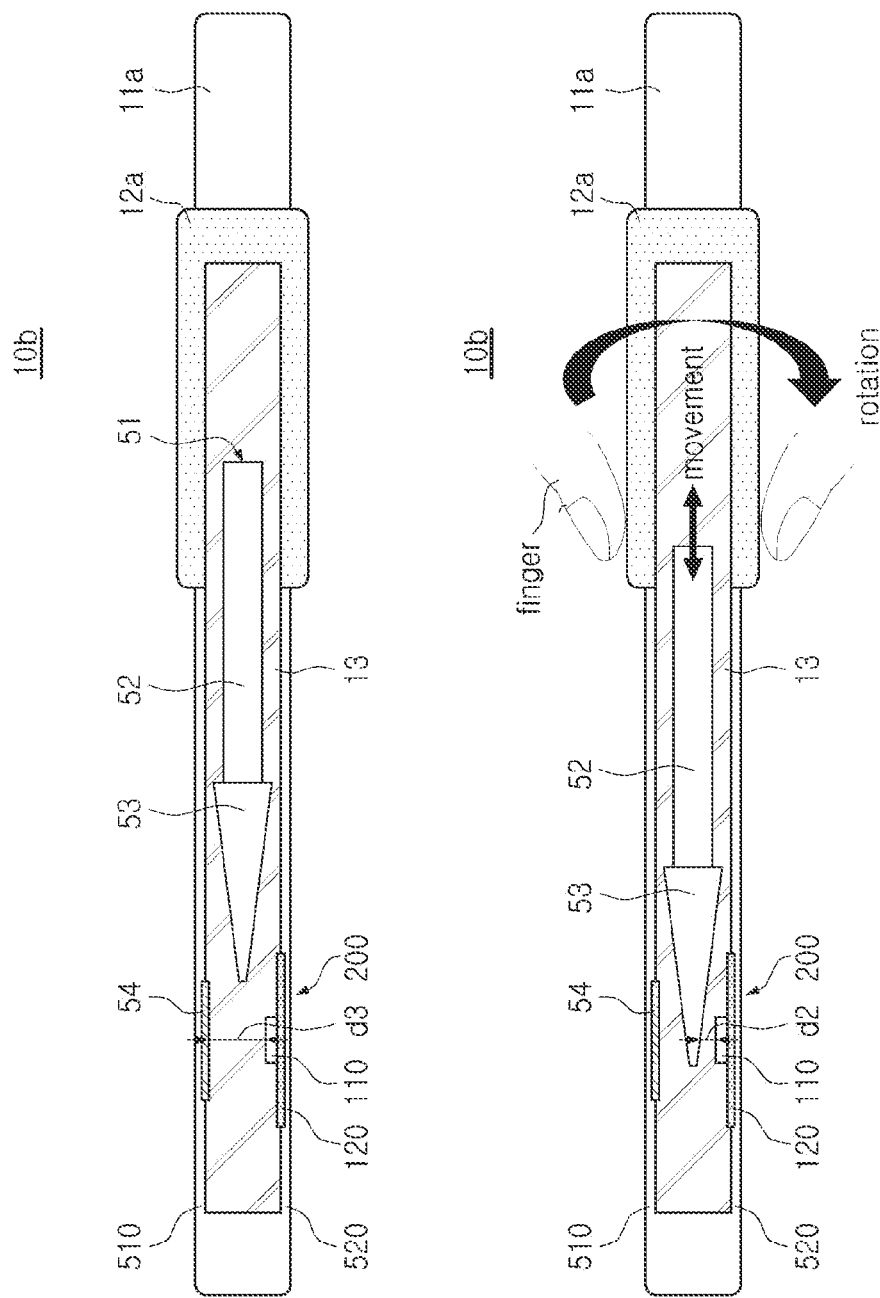
FIG. 2 is an example view illustrating an example apparatus that detects a rotor input and detects a touch and/or external force, in accordance with one or more embodiments.

FIG. 2 is an example view illustrating that an example apparatus that detects a rotor input, in accordance with one or more embodiments, detects a touch and/or external force.

Referring to FIG. 2, a reactance element 200 of an example apparatus 10*b* that detects a rotor input, in accordance with one or more embodiments, may be disposed on the other housing 520, and may have a reactance that varies according to a separation distance d3 with respect to one housing 510.

Accordingly, the reactance of the reactance element 200 may be used to detect a touch input and/or an external force input, and may also be used to detect a rotation input.

In an example, a side surface (e.g., one housing 510) of at least a portion of the portion of the core rotor 11*a*, not surrounded by the cover rotor 12*a*, may be configured in such a manner that the separation distance d3 thereof with respect to the reactance element 200 varies as external force is applied. In an example, at least a portion of each of the first housing 510 and/or the other housing 520 may include an elastic material, and at least a portion between the one housing 510 and the other housing 520 may be implemented as an empty space.

Figure 3:
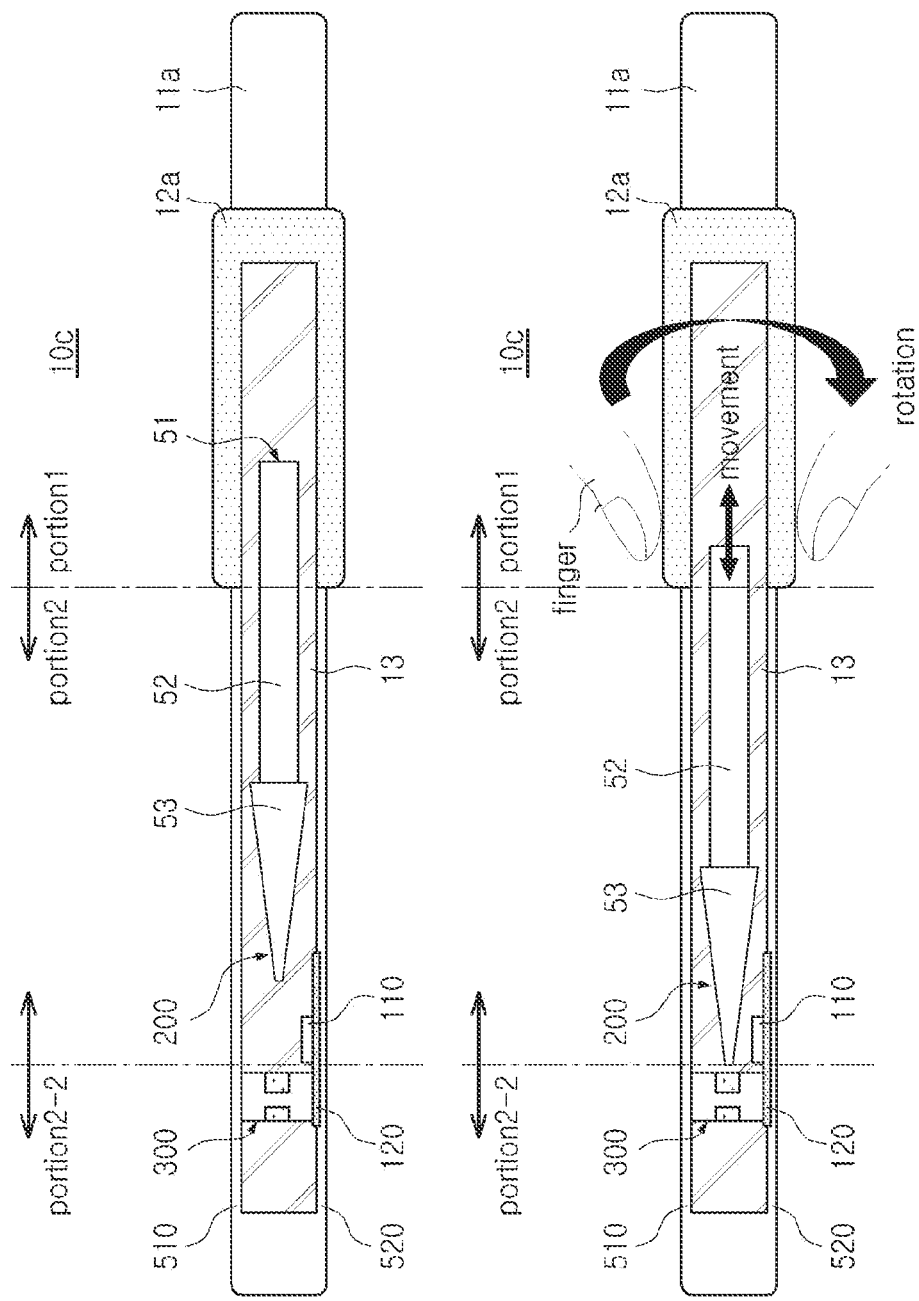
FIG. 3 is an example view illustrating a structure provided with an additional reactance element in an example apparatus that detects a rotor input, in accordance with one or more embodiments.

FIG. 3 is an example view illustrating a structure provided with an additional or second reactance element in the example apparatus that detects a rotor input, in accordance with one or more embodiments.

Referring to FIG. 3, an apparatus 10*c* that detects a rotor input may further include an additional or second reactance element 300 disposed in the rotor such that a reactance thereof changes according to a touch applied to the side surface (e.g., one housing 510 and/or the other housing 520) of the rotor, or based on an external force.

Accordingly, the reactance of the additional reactance element 300 may be used to sense a touch input and/or a force input. Depending on one or more examples, the reactance of the reactance element 200 may be used only to sense a rotation input, or may also be used to sense a rotation input and an external force input.

In an example, the sensing medium member 53 may be disposed between the motion conversion member 52 and the additional reactance element 300, and may be disposed so as not to overlap the additional reactance element 300 even when the sensing medium member 53 moves. Accordingly, since the influence of the reactance element 200 and the additional reactance element 300 on each other may be reduced, the sensing sensitivity according to the reactance of each of the reactance element 200 and the additional reactance element 300 may be improved.

The reactance element 200 and the additional reactance element 300 may overlap different regions of the side surface of the rotor. In this example, the overlapping direction may be a direction, perpendicular to the side surface, and may be a radial direction of a cylindrical coordinate system. The reactance element 200 and the additional reactance element 300 may be disposed in different regions of a common substrate 120, and may be electrically connected to a common integrated circuit (IC) disposed on the substrate 120. The substrate 120 may be implemented as a printed circuit board (PCB) or a flexible printed circuit board (FPCB).

FIGS. 4A to 4F are diagrams illustrating a reactance element of an example apparatus that detects a rotor input, in accordance with one or more embodiments.

Figure 4A:
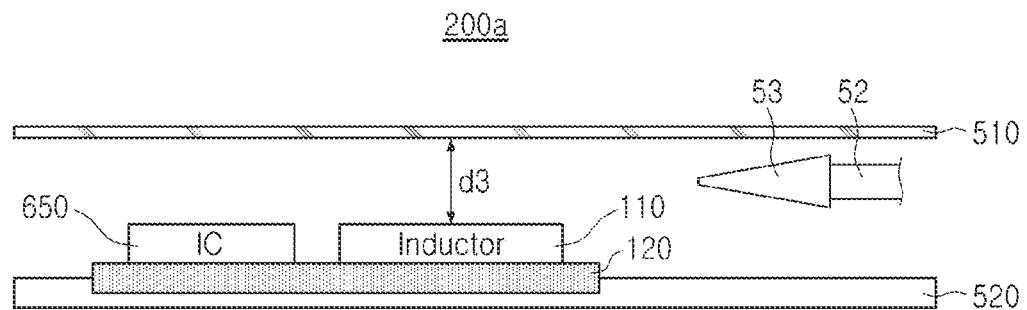
FIGS. 4A to 4F are diagrams illustrating example reactance elements of an example apparatus that detects a rotor input, in accordance with one or more embodiments.
Figure 4B:
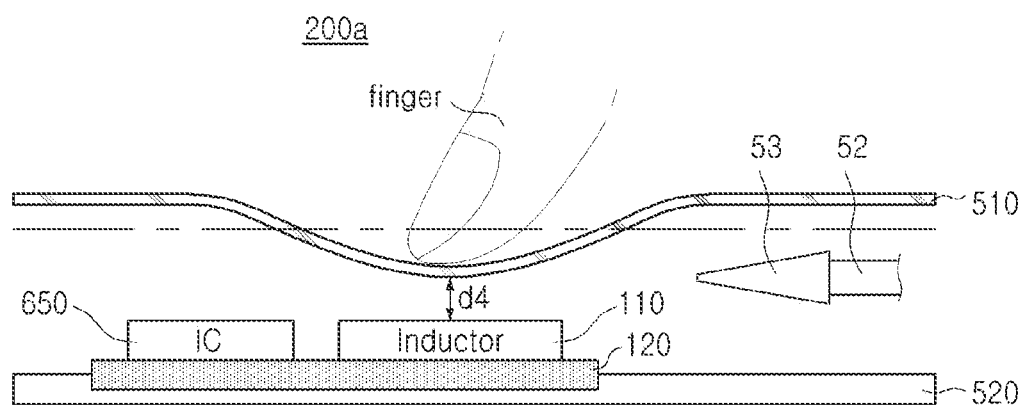

Referring to FIGS. 4A and 4B, a reactance element 200a may include a first sensing inductor 110, and the first sensing inductor 110 may have an inductance based on a third or fourth distance d3 or d4 between the first sensing inductor 110 and first housing 510.

In a non-limiting example, the first sensing inductor 110 may have a coil shape. In one or more examples, the first sensing inductor 110 may be implemented in various shapes such as a winding type, a square type, a circle type, or a track type, and may be implemented as a wiring pattern on a PCB or FPCB, or implemented as a chip inductor. A second sensing inductor and a resonant circuit inductor, which will be described later, may also be implemented in the same manner as the first sensing inductor 110.

In an example, the first sensing inductor 110 may come closer to the first housing 510 as the first housing 510 is pressed in response to an external force by a user, for example, the user's finger, and the mutual inductance of the first sensing inductor 110 may also change.

The first sensing inductor 110 may be disposed on the substrate 120 that may be included in the apparatus that detects a rotor input, and may be electrically connected to an IC 650 through the substrate 120. The substrate 120 may be disposed on the second housing 520, but the configuration is not limited thereto. In an example, the second housing 520 and the first housing 510 as illustrated in FIGS. 4A to 4F may be replaced with each other.

A first resonant circuit capacitor may also be disposed on the substrate 120. The first sensing inductor 110 may form resonance together with the first resonant circuit capacitor as the inductance thereof changes according to rotation of at least a portion of the rotor. In an example, the IC 650 may generate information on whether an external force input is applied to the rotor by detecting the resonance frequency of the resonance.

Figure 4C:
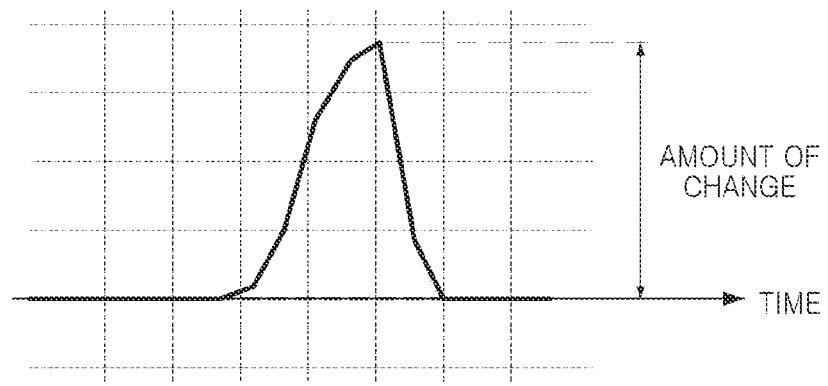

Referring to FIG. 4C, if it is assumed that an external force input is applied to the rotor at about an intermediate time, the inductance of the first sensing inductor 110 or an output value (e.g., a resonance frequency) based on the inductance may vary by the amount of change.

Figure 4D:
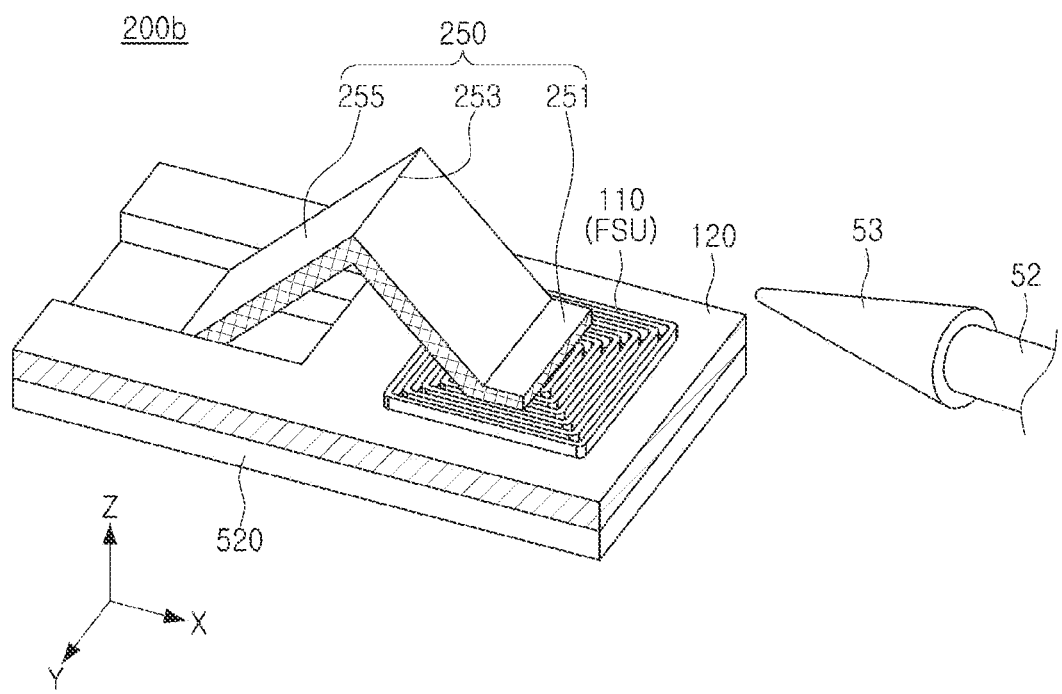
Figure 4E:
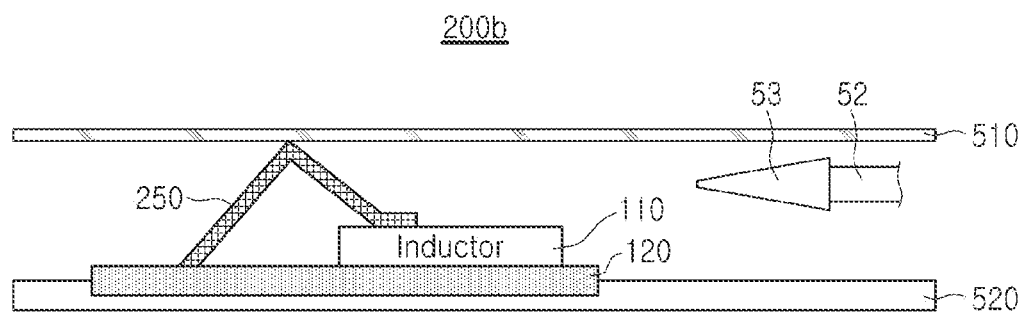

Referring to FIGS. 4D and 4E, a reactance element 200b may further include an external force expansion member 250. In an example, the external force expansion member 250 may include a conductive material and/or an elastic material, may not be electrically connected to the first sensing inductor 110, and may be connected to the second housing 520 through a portion 255.

In an example, when an external force input is applied to the first housing 510, an edge radius 253 of the external force expansion member 250 may receive the external force, an end portion 251 positioned on the first sensing inductor 110 among both ends of the external force expansion member 250 may move in the horizontal direction according to the external force, and the angle between the direction from the one end 251 toward the edge radius and the upper surface of the first sensing inductor 110 may also be changed. Accordingly, the inductance of the first sensing inductor 110 may have an inductance that is more sensitively changed according to the external force, and the external force input sensing sensitivity of the rotor may be further improved.

Figure 4F:
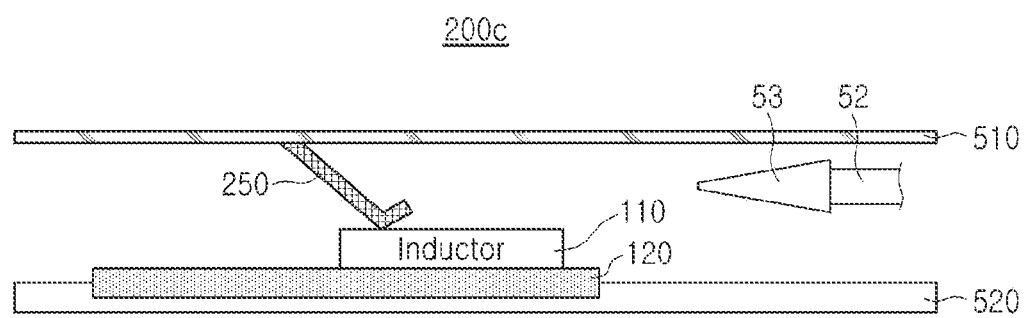

Referring to FIG. 4F, a reactance element 200c may include an external force expansion member 250 having a simpler shape. In an example, the external force expansion member 250 may be connected to only one of the second housing 520 and the first housing 510.

FIGS. 5A to 5D are diagrams illustrating additional reactance elements of an apparatus that detects a rotor input, in accordance with one or more embodiments.

Figure 5A:
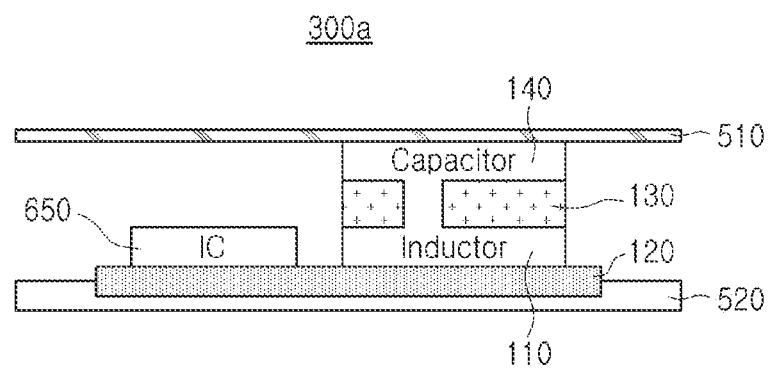
FIGS. 5A to 5D are diagrams illustrating example additional reactance elements of an example apparatus that detects a rotor input, in accordance with one or more embodiments.

Referring to FIG. 5A, an additional reactance element 300a may include at least one of a sensing capacitor 140 and a second sensing inductor 110.

The sensing capacitor 140 may have capacitance that changes depending on a touch on the side surface of the rotor, and the second sensing inductor 110 may have inductance that changes depending on an external force applied to the side surface of the rotor.

In an example, when the additional reactance element 300a includes both the sensing capacitor 140 and the second sensing inductor 110, the additional reactance element 300a may have reactance that changes depending on a touch input and an external force input in a portion of the side surface of the rotor.

Depending on the examples, the sensing capacitor 140 and the second sensing inductor 110 may form a single resonance together, or may form a plurality of resonances together with a resonant circuit inductor or a resonant circuit capacitor. In an example, the resonant circuit inductor and/or the resonant circuit capacitor may be disposed on the substrate 120.

In an example, the sensing capacitor 140 and the second sensing inductor 110 may be physically coupled to each other through a bracket 130. In a non-limited example, the bracket 130 may be formed of a non-conductor such as, but not limited to, plastic, or may be formed of a conductor such as a metal, and may be a portion of a support rotor 13 illustrated in FIGS. 1A and 1B. Depending on the one or more examples, the vertical relationship between the sensing capacitor 140 and the second sensing inductor 110 may be changed.

The sensing capacitor 140 and the second sensing inductor 110 may be disposed on the substrate 120 that may be included in the apparatus that detects rotor input, and may be electrically connected to the IC 650 through the substrate 120.

Figure 5B:
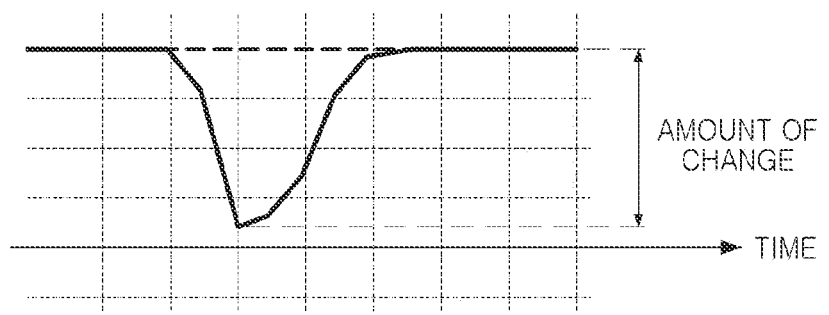

Referring to FIG. 5B, if it is assumed that a touch input is applied to the rotor at about an intermediate time, the capacitance of the sensing capacitor 140 or an output value (e.g., a resonance frequency) based on the capacitance may vary by the amount of change.

Figure 5C:
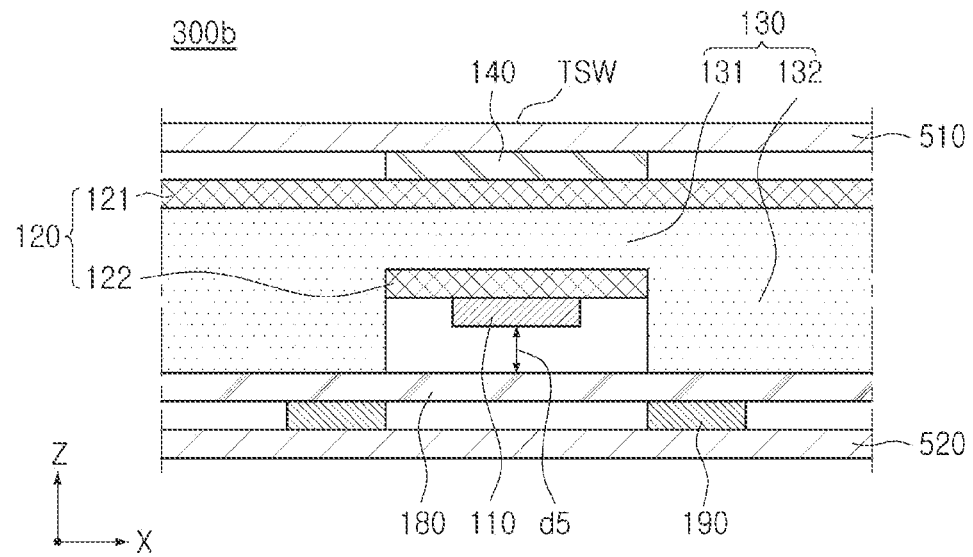
Figure 5D:
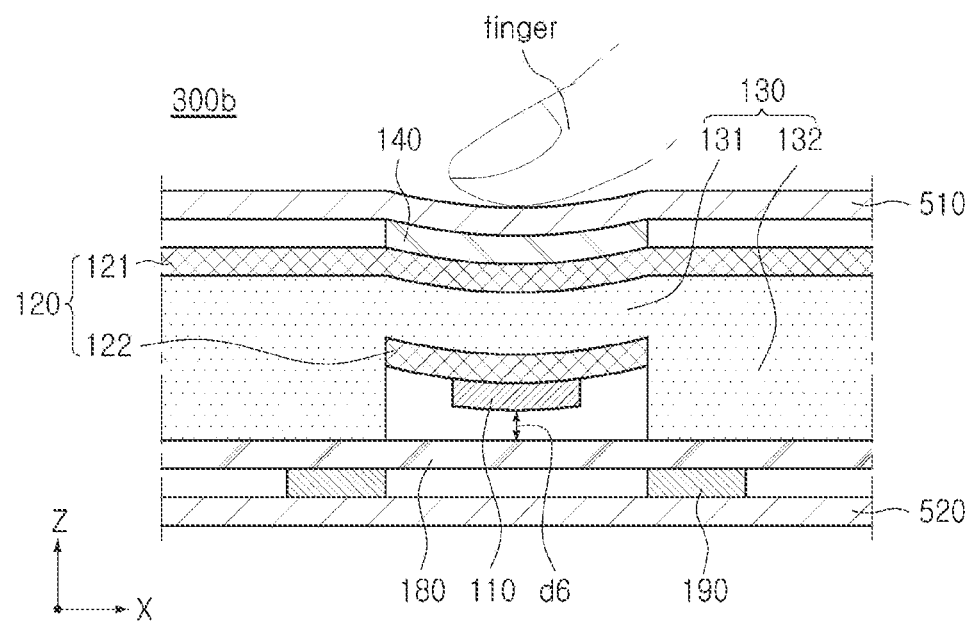

Referring to FIGS. 5C and 5D together, the additional reactance element 300a may include at least one of the second sensing inductor 110, the substrate 120, the bracket 130, and the sensing capacitor 140.

The second sensing inductor 110 may be disposed to face, and to be spaced apart from, a metal portion 180, and may approach the metal portion 180 when a touch force is applied. In this example, when the touch force is applied, the second sensing inductor 110 may have a variable inductance while moving in the touch application direction.

As illustrated in FIGS. 5C and 5D, the second sensing inductor 110 may move in a direction approaching the metal portion 180 as a touch force is applied. Then, the separation distance between the second sensing inductor 110 and the metal portion 180 may decrease, for example, from d5 to d6.

In this example, a current may flow in the second sensing inductor 110, and the magnitude of the eddy current may change due to a change in the distance between the metal portion 180, which is a surrounding conductor, and the second sensing inductor 110. Additionally, the inductance of the second sensing inductor 110 may increase or decrease due to the changed eddy current.

The substrate 120 may have an arrangement space for the second sensing inductor 110 and the sensing capacitor 140, and may be supported by the bracket 130. In one or more examples, substrates 120, on which the second sensing inductor 110 and the sensing capacitor 140 are mounted, may be formed independently of each other, or may be formed of a single substrate 120.

In an example, the substrate 120 may include a first substrate 121 and a second substrate 122 respectively disposed on a first side and a second side of the bracket 130. In one or more examples, the sensing capacitor 140 may be disposed on the first substrate 121, and the second sensing inductor 110 may be disposed on the second substrate 122. In this example, the second sensing inductor 110 and the sensing capacitor 140 may be disposed such that at least some regions overlap each other.

Specifically, in one or more examples, the first substrate 121 may be disposed between the sensing capacitor 140 and the bracket 130, and the second substrate 122 may be disposed between the second sensing inductor 110 and the bracket 130. Also, the sensing capacitor 140 may be disposed on a first side of the bracket 130, and the second sensing inductor 110 may be disposed on a second side of the bracket 130, and in this example, may be at least partially overlap the sensing capacitor 140.

In one or more examples, the first and second substrates 121 and 122 may be connected to each other to form one substrate 120, and in one or more examples, may be integrated as the entire substrate, and partial regions of the substrate 120 may be bent to be implemented as the first and second substrates 121 and 122 on both sides of the bracket 130, respectively. Accordingly, the second sensing inductor 110 and the sensing capacitor 140 may be mounted on the same surface of the substrate 120.

Additionally, the winding axis of the second sensing inductor 110 and the central axis of the touch surface of the sensing capacitor 140 may coincide with each other. Also, in this example, the center of a touch switch region TSW included in the first housing 510 may also be disposed to coincide with the winding axis of the second sensing inductor 110. In this example, on the basis of a single touch applied to the touch switch region TSW by the user, a touch force may be applied to the second sensing inductor 110, and a touch force may be applied to the sensing capacitor 140 at the same time.

The bracket 130 may be disposed between the first housing 510 and the second sensing inductor 110 to support the second sensing inductor 110, and may be deformed when a touch force is applied.

Referring to FIGS. 5C and 5D, the bracket 130 may be deformed to protrude in a direction in which the second substrate 122 is disposed, for example, in a direction in which the second sensing inductor 110 is disposed, when a touch force is applied. At this time, the first and second substrates 121 and 122 together with the bracket 130 may also be deformed to be bent in the direction to which the touch force is applied. Then, the second sensing inductor 110 disposed on the second substrate 122 may have an inductance that is variable while moving in the touch application direction by the amount of deformation of the bracket 130 and the substrate 120.

The bracket 130 may include a pair of support portions 132 respectively extending in the direction in which the second substrate 122 is disposed, and the second sensing inductor 110 may be disposed between the pair of support portions 132. Additionally, the bracket 130 may further include a pressing portion 131 disposed between the first and second substrates 121 and 122 and connecting the pair of support portions 132 to each other.

In one or more examples, the pressing portion 131 may be disposed on the same vertical line as the second sensing inductor 110 and the sensing capacitor 140, and may receive an external force based on a touch force applied to the first housing 510. Additionally, the pressing portion 131 may be bent in the direction in which the metal portion 180 is disposed according to the strength of the received external force.

A pair of support portions 132, respectively extending in the direction in which the metal portion 180 is disposed, may be disposed on both sides of the pressing portion 131, such that the separation distance between the first substrate 121 and the metal portion 180 is maintained to be constant.

In this example, the thickness of the support portion 132 in the direction in which the support portion 132 may be extended. Specifically, the thickness of the support portion 132 in the vertical direction in FIG. 5C, may be greater than the sum of thicknesses of the pressing portion 131, the second substrate 122 and the second sensing inductor 110 in the same direction. In this example, a predetermined separation distance may be formed between the second sensing inductor 110 and the metal portion 180.

Referring to FIGS. 5C and 5D, the bracket 130, including a pair of the support portions 132 and the pressing portion 131, may form one open area as a whole. In this example, the second sensing inductor 110 may be disposed in an internal space surrounded by a pair of support portions 132 and the pressing portion 131.

Specifically, partial regions between the bracket 130 and the metal portion 180 may be spaced apart from each other to be open, and the second sensing inductor 110 may be disposed in the open space. In this example, the second sensing inductor 110 may be disposed on one side of the pressing portion 131 in the open space, to be spaced apart from the metal portion 180. The bracket 130 may be formed of a non-conductor such as plastic or a conductor such as metal.

The sensing capacitor 140 may be disposed between the first housing 510 and the bracket 130, and may have a capacitance that is variable when a touch force is applied. In one or more non-limiting examples, the sensing capacitor 140 may have the form of a pad.

The sensing capacitor 140 may be disposed to be in contact with the first housing 510 of the electronic device 10, and thus may detect a change in capacitance due to an external touch being applied to the touch switch region TSW. In this example, by disposing the sensing capacitor 140 and the second sensing inductor 110 on the same vertical line, the force touch and the contact touch may be simultaneously sensed by a single touch operation.

An elastic portion 190 may be disposed to support the metal portion 180, and may be compressed and deformed by receiving an external force from the metal portion 180 when a touch force is applied. The elastic portion 190 may buffer the touch and/or external force.

Figure 6:
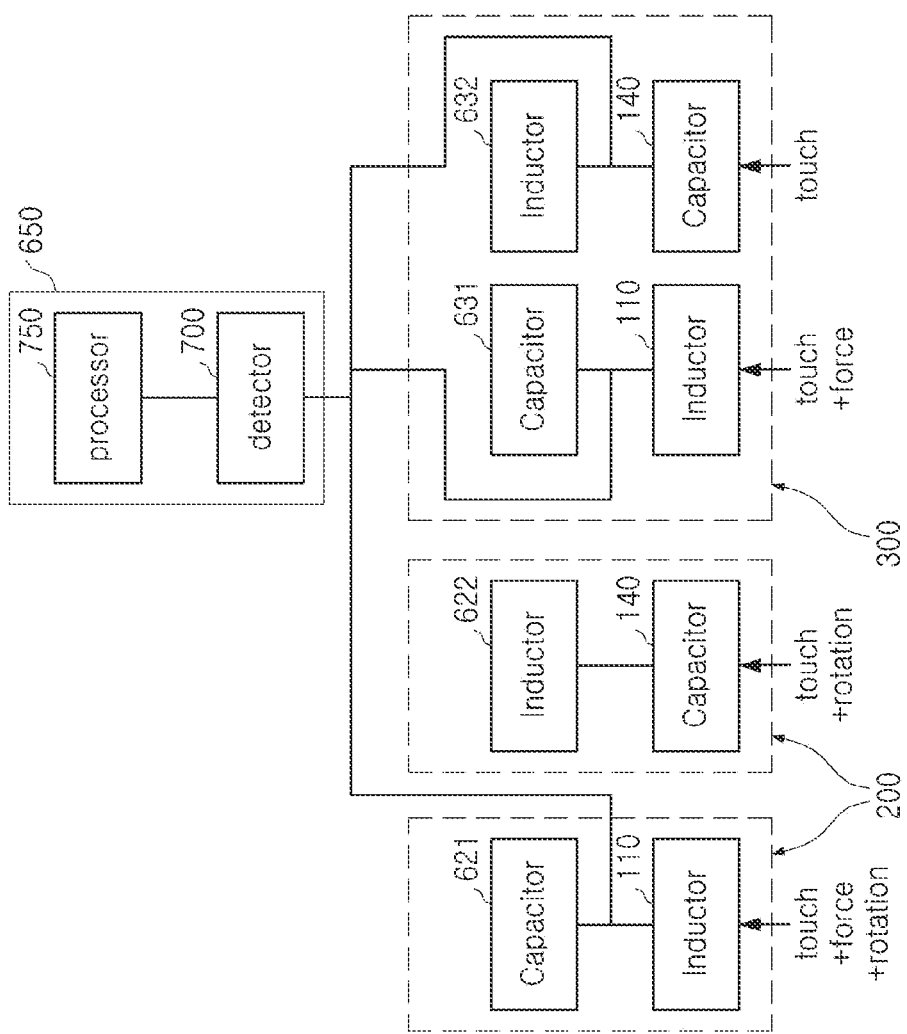
FIG. 6 is an example view illustrating an electrical connection relationship of an example apparatus that detects a rotor input according to an example.

FIG. 6 is an example view illustrating an example electrical connection relationship of an example apparatus that detects a rotor input, in accordance with one or more embodiments.

Referring to FIG. 6, the IC 650 of the example apparatus that detects a rotor input may be electrically connected to first and second sensing inductors 110, one or more sensing capacitors 140, resonant circuit capacitors 621 and 631, and resonant circuit inductors 622 and 632.

At least a portion of the reactance element 200 may include a first sensing inductor 110 and the resonant circuit capacitor 621, and the first sensing inductor 110 and the resonant circuit capacitor 621 may be electrically connected to each other, and may form resonance together.

Depending on the example, another portion of the reactance element 200 may include a sensing capacitor 140 and a resonant circuit inductor 622, and the sensing capacitor 140 and the resonant circuit inductor 622 may be electrically connected to each other, and may form resonance together.

The additional reactance element 300 may include a second sensing inductor 110, a sensing capacitor 140, a resonant circuit capacitor 631, and a resonant circuit inductor 632, and the second sensing inductor 110 and the resonant circuit capacitor 631 may be electrically connected to each other and may form resonance together. The sensing capacitor 140 and the resonant circuit inductor 632 may be electrically connected to each other and may form resonance together. Depending on the example, the resonant circuit capacitor 631 and the resonant circuit inductor 632 of the additional reactance element 300 may be omitted, and the second sensing inductor 110 and the sensing capacitor 140 may be electrically connected to each other, and may form resonance together.

The IC 650 may include at least one of a detector 700 and a processor 750. In one or more examples, the detector 700 may include at least a portion of an analog-to-digital converter, an amplifier, a buffer, and a feedback circuit, and the processor 750 may include a digital circuit configured to generate information corresponding to whether or not an input is sensed based on an output value of the detector 700.

Figure 7A:
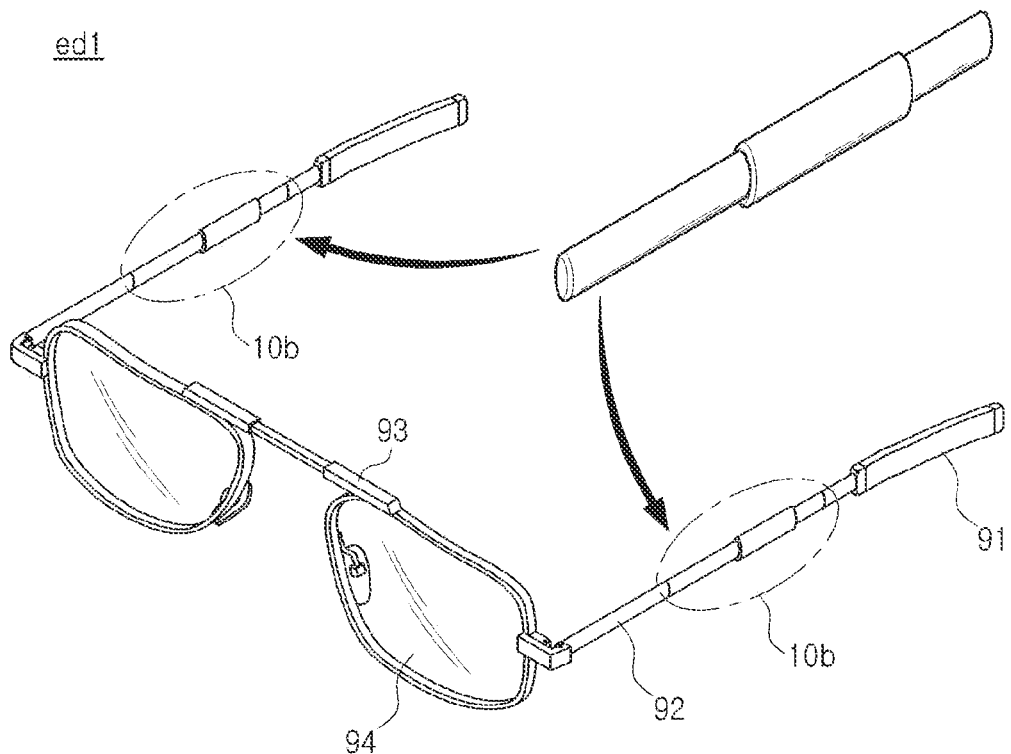
FIGS. 7A to 7C are diagrams illustrating example electronic devices including an apparatus that detects a rotor input, in accordance with one or more embodiments.
Figure 7B:
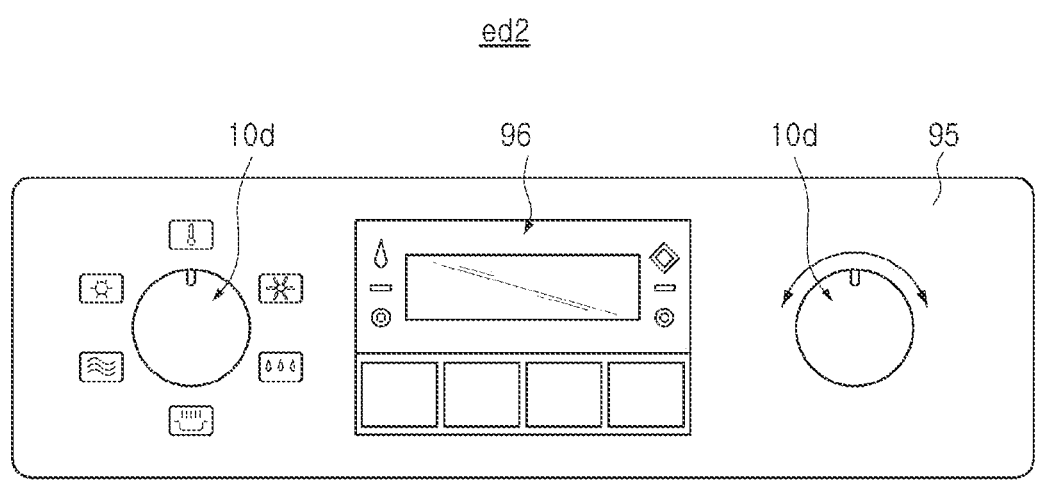
Figure 7C:
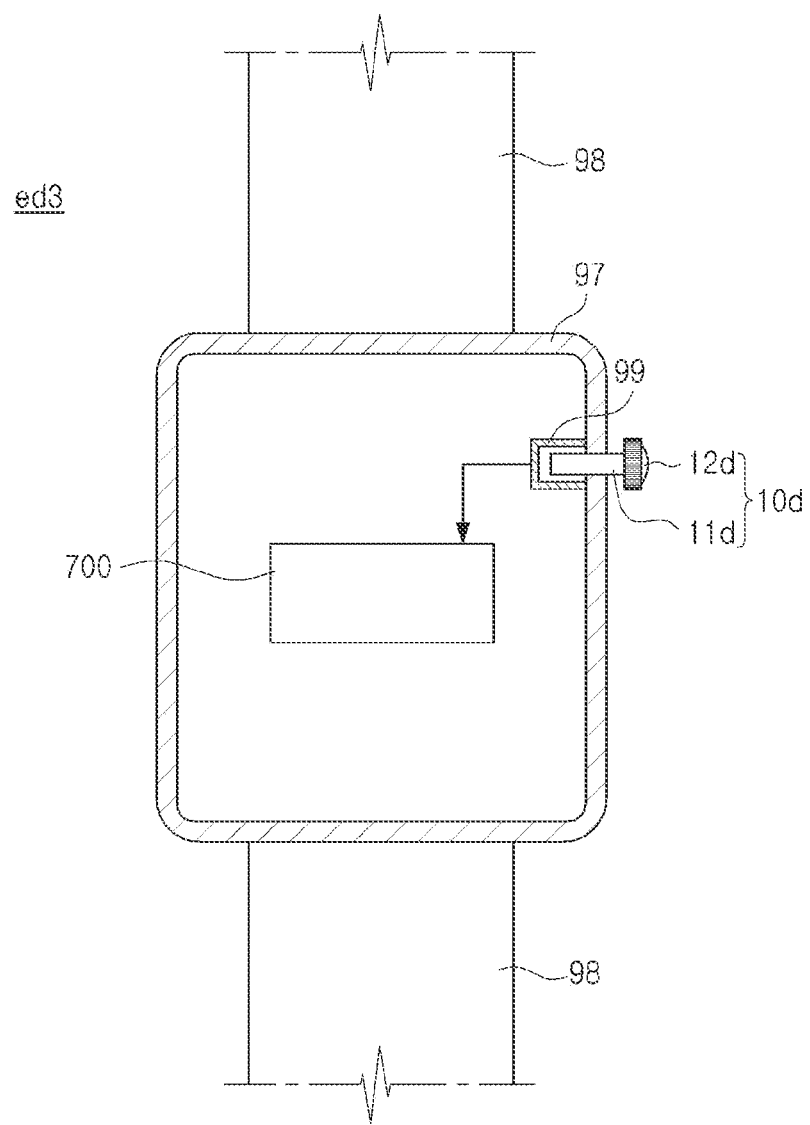

FIGS. 7A to 7C are diagrams illustrating example electronic devices including an example apparatus that detects a rotor input, in accordance with one or more embodiments.

Referring to FIG. 7A, an electronic device ed1 including the example apparatus 10b that detects a rotor input may include a body, and the body may be at least a portion of a wearable electronic device.

In an example, the body may include at least one of a first member 91, a second member 92, a third member 93, and a fourth member 94, and may be at least a portion of electronic glasses. The apparatus 10b that detects a rotor input may be connected between the first and second members 91 and 92, the third member 93 may be connected between the plurality of second members 92, and the fourth member 94 may be connected to the third member 93.

In one or more examples, the respective first, second, and third members 91, 92 and 93 may be implemented with a light insulating material such as, but not limited to, plastic, and may have a structure in which a wire electrically connected to the apparatus 10b that detects a rotor input is embedded. The fourth member 94 may be implemented with a transparent material such as, but not limited to, glass, and may be configured to display electromagnetically, such as a display panel of an electronic device. The second member 92 may include an IC controlling the display of the fourth member 94, and the IC may be electrically connected to the apparatus 10b for detecting rotor input and/or the fourth member 94.

Referring to FIG. 7B, an electronic device ed2 including an example apparatus 10d that detects a rotor input may include a body, and the body may be at least a portion of a home appliance, e.g., a refrigerator, an oven, a washing machine, an air purifier, a water purifier, or the like.

In one or more examples, the body may include at least one of a fifth member 95 and a sixth member 96. The sixth member 96 may be implemented with a transparent material such as, but not limited to, glass, and may be configured to display electromagnetically, such as a display panel of an electronic device. The fifth member 95 may include an IC to control the display of the sixth member 96, and the IC may be electrically connected to the example apparatus 10d that detects a rotor input and/or the sixth member 96.

Referring to FIG. 7C, an electronic device ed3 including the apparatus 10d for detecting rotor input according to an example may include a body, and the body may be at least a portion of a wearable electronic device.

For example, the body may include at least one of a seventh member 97, an eighth member 98, and a ninth member 99, and may be at least a portion of an electronic watch. The example apparatus 10d that detects a rotor input may be connected to the seventh member 97, and the eighth member 98 may be connected to the seventh member 97, to be configured to be worn by a user like a strap, and the ninth member 99 may be electrically connected between the IC embedded in the electronic watch and the example apparatus 10d that detects a rotor input. The example apparatus 10d that detects a rotor input may include a core rotor 11d and a cover rotor 12d, and may be at least a portion of a crown of the electronic watch.

In addition to the electronic devices ed1, ed2 and ed3 illustrated in FIGS. 7A to 7C, other electronic devices including an example apparatus that detects a rotor input may include, as non-limiting examples, a smart watch, smartphone, personal digital assistant, digital video camera, digital still camera, network system, computer, monitor, tablet PC, laptop computer, netbook computer, television set, video game, automotive, or the like, but is not limited thereto. Depending on the example, the example electronic device including an apparatus that detects a rotor input may include a storage element storing data, such as a memory or a storage, may include a communication element remotely transmitting and receiving data, such as a communication modem or an antenna, and may include a processor that may be implemented as a central processing unit (CPU), a graphics processing unit (GPU), a microprocessor, an application specific integrated circuit (ASIC), field programmable gate arrays (FPGA), or the like.

The processor may be interlocked with a memory or storage, and may generate information based on the output of the IC of the apparatus that detects a rotor input. Accordingly, the electronic device may generate various information based on the input sensed by the apparatus that detects a rotor input, and may output the information through a display panel.

As set forth above, according to an example, a rotor may have an advantageous structure to efficiently detect a rotation input or to be smaller compared to the rotation detection sensitivity. Alternatively, according to an example, a rotor may have an effective structure in which a for sensing a rotation input and a structure for sensing a touch and/or external force input are integrated.

While this disclosure includes specific examples, it will be apparent after an understanding of the disclosure of this application, that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A rotor input detecting apparatus, comprising:
a rotor comprising at least a portion which is configured to rotate around an axis of rotation;
a first reactance element disposed in the rotor;
a sensing member disposed in the rotor; and
a motion conversion member configured to move in the rotor based on a rotation of the portion of the rotor, and configured to move together with the sensing member to change a reactance of the first reactance element according to the rotation of the portion of the rotor.

2. The apparatus of claim 1, wherein the motion conversion member is configured to move such that a separation distance between the first reactance element and the sensing member changes based on the rotation of the portion of the rotor.

3. The apparatus of claim 1, wherein at least a portion of a surface of the sensing member is inclined with respect to a side surface of the rotor.

4. The apparatus of claim 1, wherein the first reactance element is disposed to overlap the sensing member in a direction perpendicular to a side surface of the rotor based on a movement of the motion conversion member.

5. The apparatus of claim 1, wherein the motion conversion member is configured to perform motion conversion between a rotational motion and a translational motion.

6. The apparatus of claim 1, wherein at least a surface of the sensing member is configured to have a conductivity higher than a conductivity of the motion conversion member.

7. The apparatus of claim 1, wherein the rotor comprises a core rotor and a cover rotor configured to cover a portion of the core rotor, and
the motion conversion member is configured to move together with the sensing member such that the reactance of the first reactance element changes based on a relative rotation of the cover rotor with respect to the core rotor.

8. The apparatus of claim 7, wherein the first reactance element is disposed in a portion of the core rotor that is not surrounded by the cover rotor, and
at least a portion of the motion conversion member is surrounded by the cover rotor.

9. The apparatus of claim 8, wherein a side surface of at least a portion of the core rotor, not surrounded by the cover rotor, is configured to vary a separation distance with respect to the first reactance element when an external force is applied to the rotor.

10. The apparatus of claim 1, further comprising a reference member connected to the sensing member, and configured to overlap the first reactance element in a direction perpendicular to a side surface of the rotor based on a movement of the motion conversion member,
wherein a surface of the reference member, facing the side surface of the rotor, is inclined with respect to a surface of the sensing member facing the side surface of the rotor.

11. The apparatus of claim 1, further comprising a first resonant circuit capacitor disposed in the rotor,
wherein the first reactance element comprises a first sensing inductor, and an inductance of the first sensing inductor is changed based on a rotation of at least the portion of the rotor to form a resonance together with the first resonant circuit capacitor.

12. The apparatus of claim 11, further comprising a second reactance element disposed in the rotor, wherein a reactance of the second reactance element is changed based on one of a touch and an external force applied to a side surface of the rotor,
wherein the second reactance element comprises a sensing capacitor disposed in the rotor, and a capacitance of the sensing capacitor is changed based on the touch applied to the side surface of the rotor.

13. The apparatus of claim 1, further comprising a second reactance element disposed in the rotor, wherein a reactance of the second reactance element changes based on one of a touch and an external force applied to a side surface of the rotor.

14. The apparatus of claim 13, wherein the second reactance element comprises:
a sensing capacitor disposed in the rotor, wherein a capacitance of the sensing capacitor changes based on the touch applied to the side surface of the rotor; and
a second sensing inductor disposed in the rotor, wherein an inductance of the second sensing inductor changes based on an external force applied to a portion of the side surface of the rotor, overlapping the sensing capacitor.

15. The apparatus of claim 13, wherein the sensing member is disposed between the motion conversion member and the second reactance element.

16. The apparatus of claim 1, further comprising:
an integrated circuit (IC) electrically connected to the first reactance element; and
a substrate on which the IC and the first reactance element are disposed.

17. The apparatus of claim 16, further comprising a second reactance element disposed in the rotor, wherein a reactance of the second reactance element is changed based on one of a touch and an external force applied to a side surface of the rotor, wherein the second reactance element is electrically connected to the IC and is disposed on the substrate.

18. An electronic device, comprising:
a rotor input detecting apparatus, the rotor detecting apparatus comprising
   a rotor comprising at least a portion which is configured to rotate around an axis of rotation;
   a first reactance element disposed in the rotor;
   a sensing member disposed in the rotor;
   a motion conversion member configured to move in the rotor based on a rotation of the portion of the rotor, and configured to move together with the sensing member to change a reactance of the first reactance element according to the rotation of the portion of the rotor, and
a body connected to the rotor.

19. The electronic device of claim 18, wherein the body is at least a portion of a wearable electronic device.

* * * * *